United States Patent
Fontana et al.

(10) Patent No.: US 6,934,593 B2
(45) Date of Patent: Aug. 23, 2005

(54) PROCESS FOR NOISE REDUCTION, PARTICULARLY FOR AUDIO SYSTEMS, DEVICE AND COMPUTER PROGRAM PRODUCT THEREFOR

(75) Inventors: Federico Fontana, Pordenone (IT); Mario Bricchi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 401 days.

(21) Appl. No.: 10/171,403

(22) Filed: Jun. 12, 2002

(65) Prior Publication Data

US 2003/0004591 A1 Jan. 2, 2003

(30) Foreign Application Priority Data

Jun. 28, 2001 (EP) .............................................. 01830438

(51) Int. Cl.⁷ ........................... G06F 17/00; H03G 7/00; H03G 3/00
(52) U.S. Cl. ............................ 700/94; 381/106; 381/108
(58) Field of Search .......................... 700/94; 381/108, 381/102, 106; 333/14

(56) References Cited

U.S. PATENT DOCUMENTS

| | | | |
|---|---|---|---|
| 4,068,139 A | | 1/1978 | Bray |
| 4,498,060 A | * | 2/1985 | Dolby ........................... 333/14 |
| 5,170,434 A | * | 12/1992 | Anderson .................... 381/317 |
| 5,467,282 A | * | 11/1995 | Dennis ........................ 701/215 |
| 5,586,191 A | * | 12/1996 | Elko et al. ..................... 381/92 |
| 5,687,229 A | * | 11/1997 | Sih ........................ 379/406.09 |
| 5,953,660 A | * | 9/1999 | Ryde et al. .................. 455/423 |
| 5,974,156 A | | 10/1999 | Sauvagerd |
| 6,675,144 B1 | * | 1/2004 | Tucker et al. ............... 704/264 |

OTHER PUBLICATIONS

Adaptive Filters Suitable for Real–Time Spectral Analysis— (IEEE Paper0098–4094/86/0200–0218) 1986.*

"Dolby Licensee Informational Manual: Noise Reduction", Issue 6, Dolby, ©1999 Dolby Laboratories, Inc., S99/12730.

* cited by examiner

Primary Examiner—Sinh Tran
Assistant Examiner—Andrew Flanders
(74) Attorney, Agent, or Firm—Carol W. Burton, Esq.; William J. Kubida, Esq.; Hogan & Hartson L.L.P.

(57) ABSTRACT

A device for decoding audio signals subjected to a noise-reduction encoding such as a Dolby-B encoding comprises a plurality of processing blocks (612, 616, 620, 624, 628, 632, 636, 640) for generating, starting from an input signal (610) containing the audio signal subjected to encoding superimposed on a noise component, an output signal (626) consisting of a replication of the audio signal with the noise component reduced. The aforesaid processing blocks are implemented in a digital form and comprise a sliding-band filtering structure (612) fed with the input signal (610) and designed to generate a filtered signal (614). The filtered signal (614) is fed, according to a general feedforward scheme, to an overshoot-suppression stage (616) in view of the generation, in an adder node (620), of a difference signal (622) starting from which the output signal is obtained via filtering (624). The same filtered signal (614) is also used to drive a control chain (632, 636, 640) preceded by a further linear filter (628). The control chain generates respective control signals for the sliding-band filtering structure (612) and for the filters (624, 628) that reproduce the output signal (626) and the input signal (630) for the control chain. The aforesaid two filters (624, 628) are preferably all-pole filters, the function of which is to minimize the error introduced by the sliding-band filtering structure (612).

29 Claims, 8 Drawing Sheets

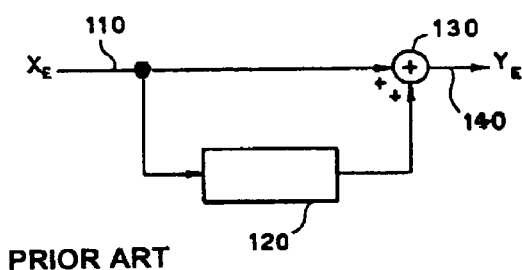
Fig_1a
PRIOR ART
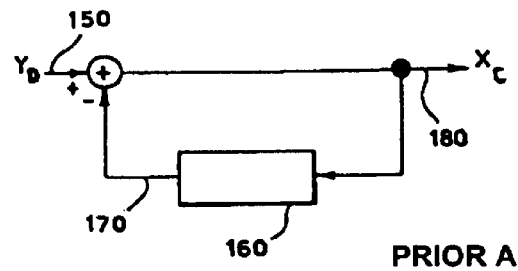
Fig_1b
PRIOR ART
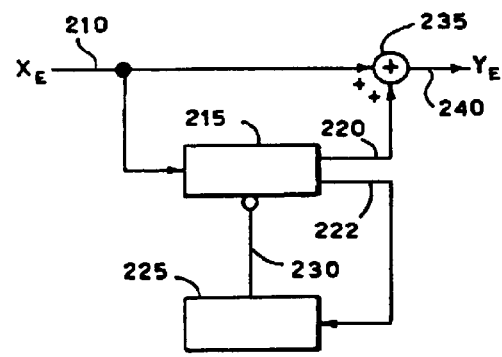
Fig_2a
PRIOR ART
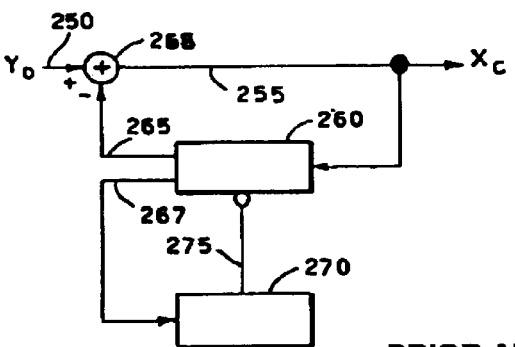
Fig_2b
PRIOR ART
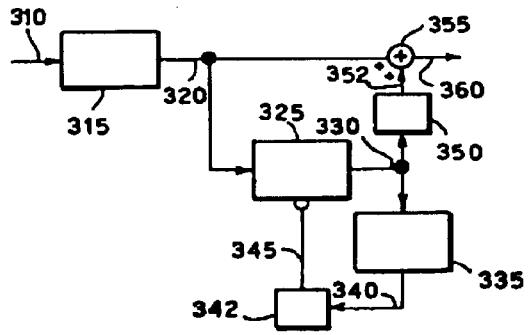
Fig_3a
PRIOR ART
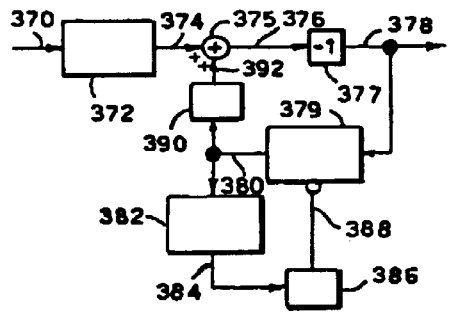
Fig_3b
PRIOR ART

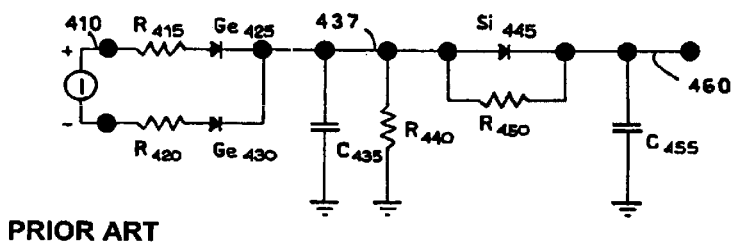
Fig_4
PRIOR ART
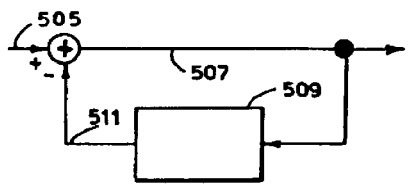
Fig_5a
PRIOR ART
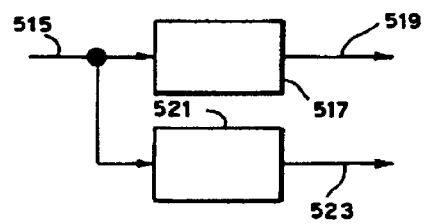
Fig_5b
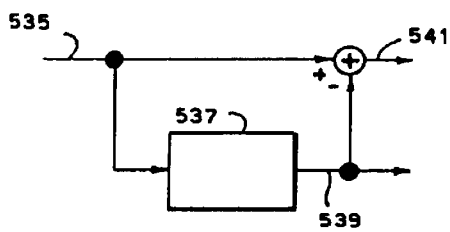
Fig_5c
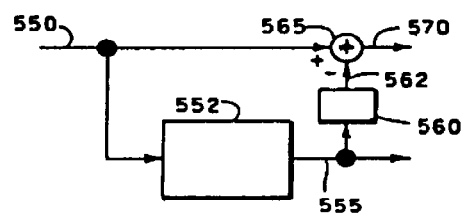
Fig_5d Fig_6a
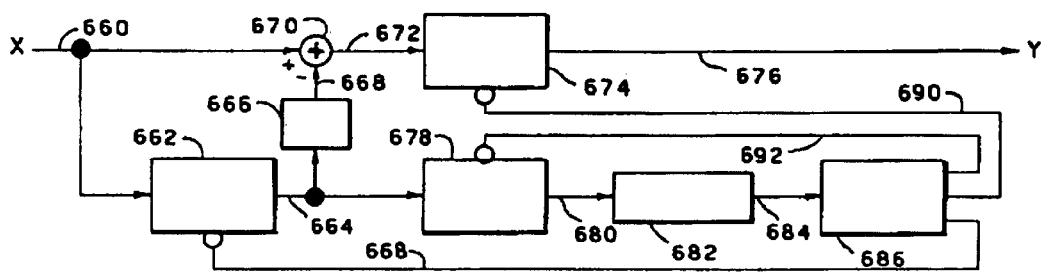
Fig_6b
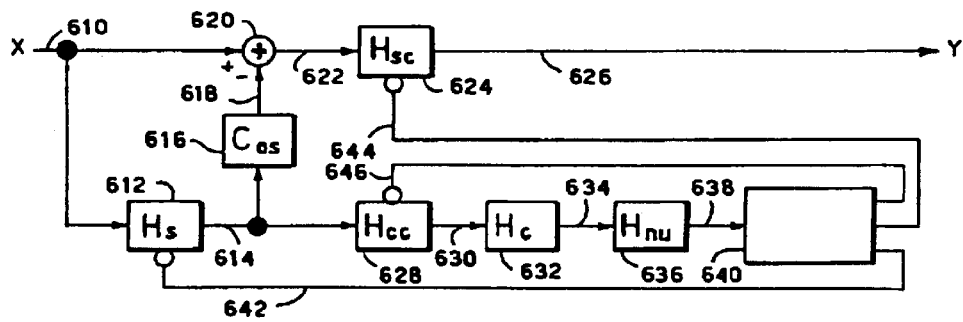
Fig_7
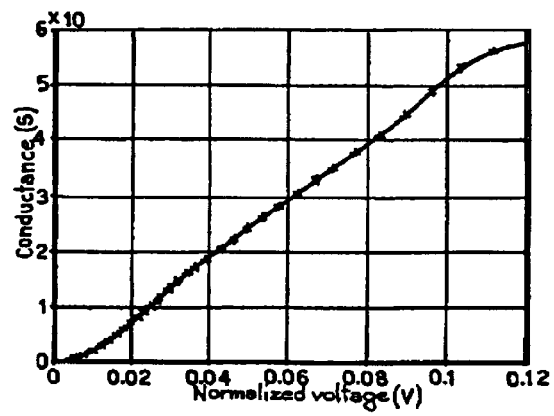

Fig_8
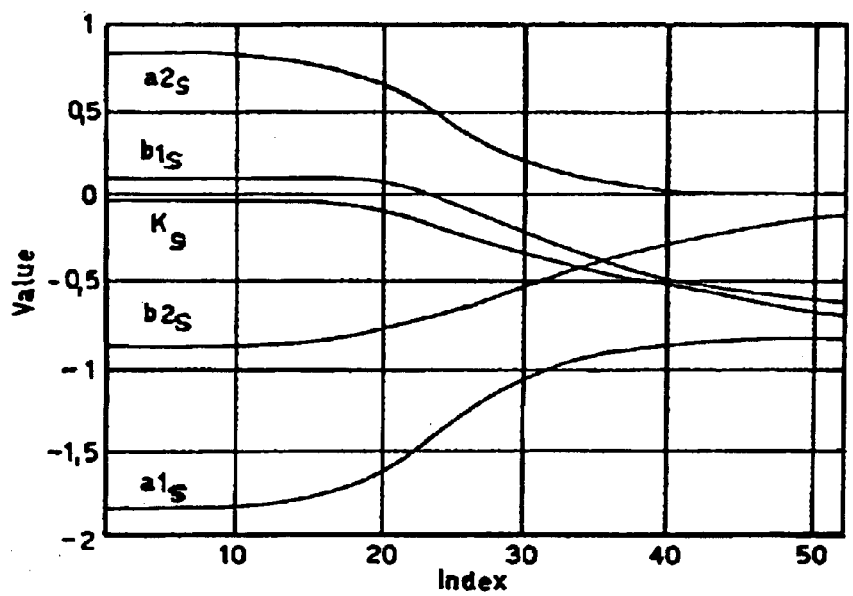
Fig_9
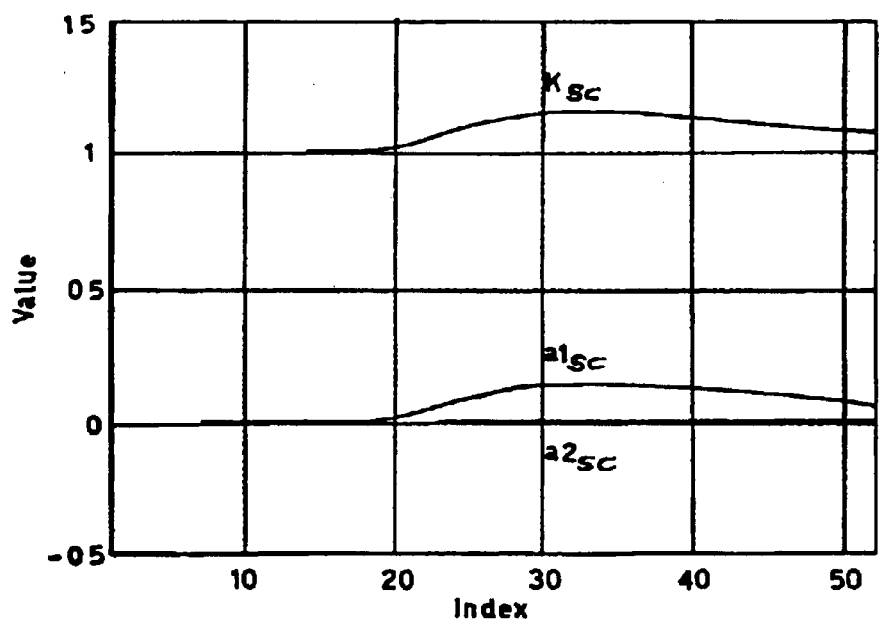

Fig_10
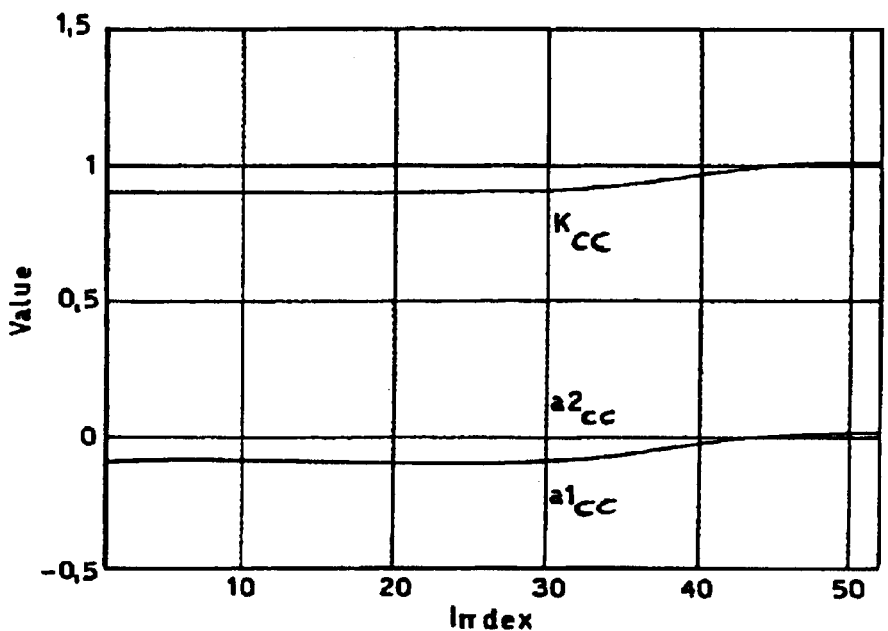
Fig_11
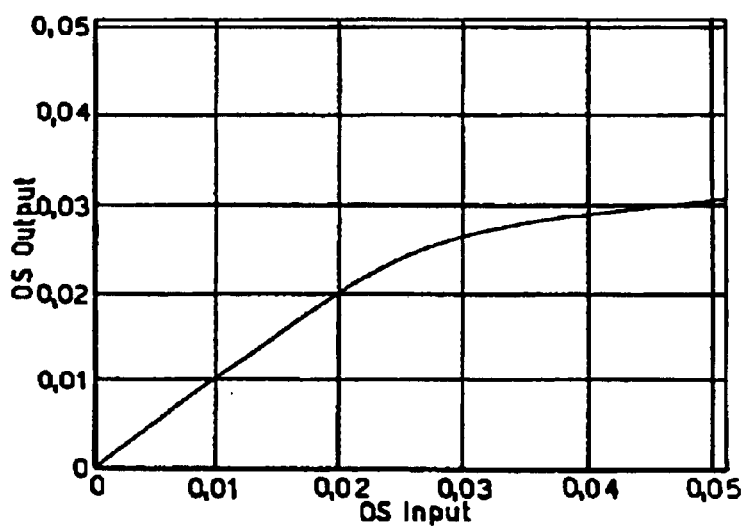

Fig_12
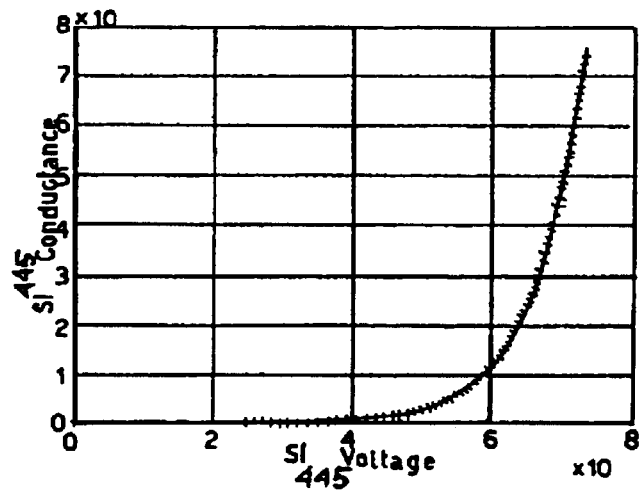
Fig_13
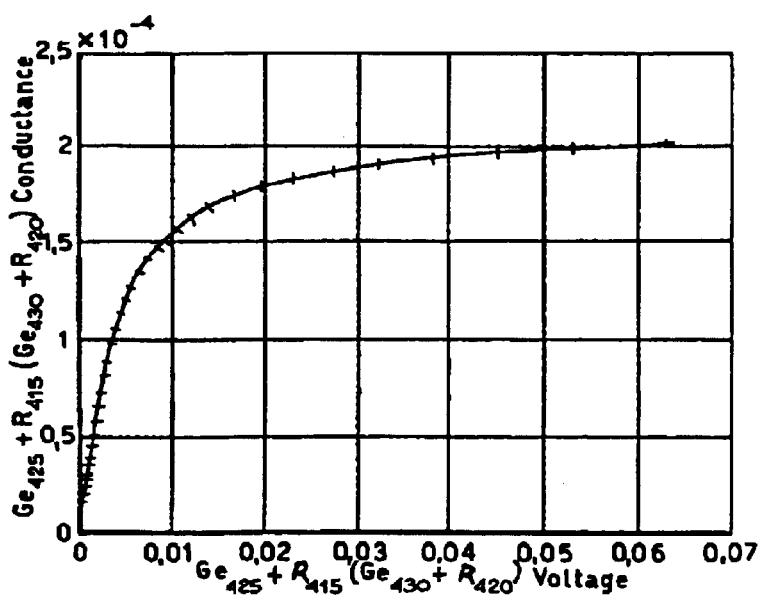

Fig_16
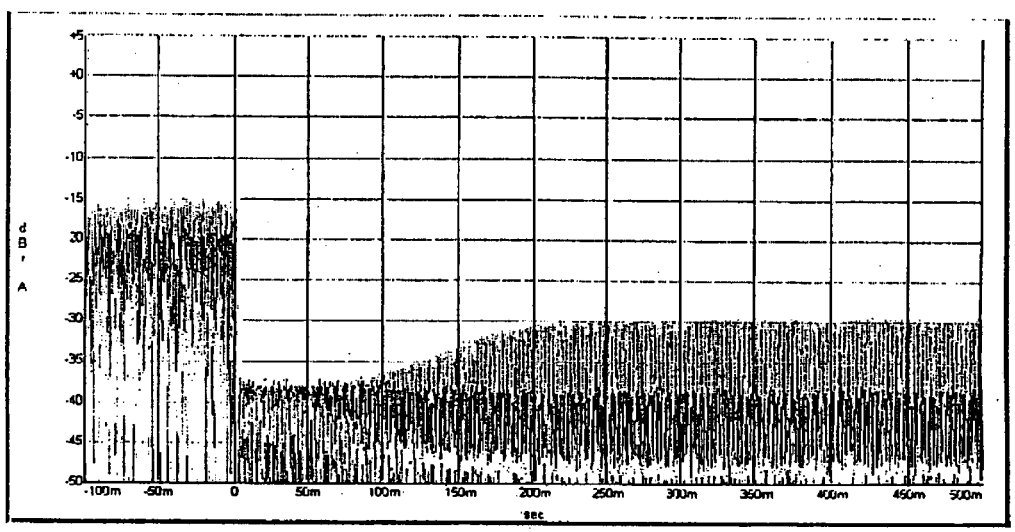

PROCESS FOR NOISE REDUCTION, PARTICULARLY FOR AUDIO SYSTEMS, DEVICE AND COMPUTER PROGRAM PRODUCT THEREFOR

FIELD OF THE INVENTION

The present invention relates to techniques for noise reduction and has been developed with particular attention paid to the possible use for decoding encoded audio signals, adopting noise-reduction techniques, for example Dolby techniques, such as the Dolby-B technique.

BACKGROUND OF THE INVENTION

It is well known that digital recording of audio signals, such as music signals, affords numerous advantages during playback. One of the major advantages is the absence, during sound reproduction, of the intrinsic noise of the physical medium on which the audio information is recorded. Since digital recording stores the audio information in the form of numbers, it is possible to recover the same information during playback, hence in a way independent of the playback means. Of course, there exists an intrinsic noise of the digital signal, such as quantization distortion, but it is possible to prove that this noise is in fact inaudible once certain conditions at the level of digital recording are observed. Instead, analog recording requires the audio information to be "written" in the form of an analog signal. In most cases the reproduction medium is a magnetic tape, which is polarized with a magnetic field determined by the analog signal. In this way, it should be possible to read the same signal during playback by reading the polarization of the tape. Unfortunately a magnetic tape, even if it is of the best quality, in any case presents in regard to an analog playback system a residual level of polarization which can be perceived in the form of a low-level wideband noise also referred to as tape noise.

Nevertheless, analog audio recording is today widely used for example in the car-radio and cassette-recorder sector. Even though it is possible to record a digital signal on a magnetic tape, there exists a large number of car radios and cassette recorders which are in fact incompatible with, and hence not suited for, reproduction of audio material in a digital format. In addition, there is an enormous amount of audio cassettes recorded in analog format which thus require the availability of analog playback equipment.

In the past various noise-reduction systems have been proposed aimed at reducing the effects of tape noise. Such systems usually convert the analog signal into a new one, which is less sensitive to tape noise. This conversion is referred to as "encoding". During playback, the encoded signal is not designed to be reproduced as it is, in so far as the encoding process, which is designed to render the signal less sensitive to tape noise, modifies (sometimes to a significant extent) the audio information. For this reason, the encoded signal is normally subjected to a second conversion, which is carried out at the playback stage, referred to as "decoding". The decoding operation is designed to reproduce in a dual way, i.e., in a complementary way, the encoding process and to reconstruct the original recorded signal as faithfully as possible.

Clearly, proper decoding can be performed only if the encoding system enables a decoder to be made that is able to reconstruct the original audio signal without error, i.e., exactly counterbalancing the action of the encoder. Otherwise, decoding becomes inherently prone to reconstruction errors. A class of noise-reduction systems that has met with a great deal of success is based on the idea of boosting the audio signal during the encoding process, in particular when the dynamic level is low. In this way, the encoded signal is less sensitive to low-level additional noise, such as precisely tape noise, than is the original audio signal. Decoding implies an action of reduction of the level of the encoded signal, in such a way that the original audio information is restored. Using this technique, any other additional signal superimposed on the encoded signal, such as tape noise, is attenuated.

Since tape noise is predominant at higher frequencies, as in case of compact cassettes, the encoding/decoding process described above can be performed only where these frequency components are present, leaving the other signal components unaltered. This approach lies at the basis of noise-reduction techniques known as Dolby techniques, and in particular the Dolby-B technique. These are techniques widely used for noise reduction, as is described, for example, in the publication "Dolby Licensee Information Manual: Noise Reduction," issue 6, Dolby Laboratories Licensing Corporation (1999).

Since the music industry continues to produce compact cassettes recorded in analog format, noise-reduction decoders of the same type as Dolby-B decoders implemented, for example, in the car-radio industry, have so far been built exclusively using analog-signal processing techniques (i.e., using circuits comprising resistors, capacitors and other analog electronic components).

Over the last few years, the car-radio industry has identified in digital signal processors (DSPs) the most convenient alternative to dedicated analog circuits. In fact, any currently available analog circuit designed specifically for a given purpose may be reproduced most effectively in the form of an algorithm which is run on a DSP purposely programmed for emulating the given circuit. In this way, most of the functions available in a car radio, in particular reduction of the tape noise, can be performed by a DSP, provided that an appropriate software capable of emulating the functions of the analog circuit is made available. This software can be updated, redesigned, reconfigured and modified according to software evolution, industry and market trends, in a way altogether independent of the processing device itself. Furthermore, since digital-signal processing device are constantly decreasing in cost and increasing in performance, it is possible also for the device to be updated, leaving the functions, configurations and performance of the software unaltered. In addition, digital-signal processing devices are largely insensitive to variations in manufacturing lots and variations due to temperature given that they basically carry out arithmetic operations instead of implementing transfer functions of an analog type. This fact constitutes a further advantage as regards implementation based on digital processors, since in noise-reduction systems the tolerances in regard to variations in component parameters must be very stringent in order to avoid any possible mismatches between encoder and decoder. Such mismatches may lead to perceptible differences between the original audio information and the audio information present in the decoded signal. A digital implementation of the decoder is thus free from any possible mismatches caused by tolerance faults in the decoder components.

What has been said so far is, however, true only up to a point.

Techniques are in fact known which enable design of digital-signal processing systems which merely implement pre-existing analog-signal processing systems. There are moreover known techniques which enable implementation in digital form of analog feedback-controlled networks, where the non-linear components are intrinsically grouped together in one or more control sub-networks. In spite of this, certain noise-reduction systems of the Dolby-B type cannot be implemented simply by converting their blocks into the digital domain, or by grouping together their non-linear blocks into one or more sub-networks designed to control one or more linear blocks. Indeed, the currently accepted idea in the sector is that the operation of decoding encoded signals using noise-reduction systems of a known type, such as Dolby B, cannot be implemented satisfactorily in digital form. This fact is believed to be due to the decoding strategy adopted in systems of the Dolby-B type and similar systems.

FIGS. 1a and 1b of the attached drawings are high-level representations of the structure used by Dolby B and similar systems to encode (FIG. 1a) and decode (FIG. 1b) audio signals. In detail, the audio signal $X_E$ 110 to be encoded passes through an encoding block 120, the output of which is added to the original signal by means of an adder 130 so as to produce the encoded signal $Y_E$ 140. During playback, the signal $Y_D$ 150 (which is made up of the encoded signal $Y_E$ 140 and the tape noise) is decoded to produce an audio signal $X_D$ 180, in which the tape noise is reduced. The decoding process uses a decoding block 160 identical to the block 120. The signal 180 is fed back to the block 160 so as to produce an encoded version of the reconstructed signal 170, which is to be subtracted from the signal 150 to produce the decoded audio signal.

It can be shown that the decoder in fact reconstructs at output the original audio signal XE 110 from the signal 150—in the absence of tape noise. Intuitively, if the decoder produces a signal 180 identical to the signal 110, then the latter signal can be used to calculate the signal 170. Given the equality between the blocks 120 and 160, the signal 170 can be subtracted from the signal 150 so as to reconstruct the original audio signal. In practice, a noise-reduction system of the same type as the Dolby-B system comes close to satisfying the hypothesis of absence of tape noise, given that it cancels out the typical tape noise of a compact cassette, as this noise may be perceived during playback. Furthermore, this architecture presents a clear practical advantage in terms of implementation of the noise-reduction system by means of analog circuits, since both the encoder and the decoder use the same electronic components.

To illustrate the concept more clearly, in FIGS. 2a and 2b the blocks 120 and 160 have been expanded and represented as conceptually divided into a filtering part and a control part. Both parts of the decoder are identical to homologous parts of the encoder. In the encoder shown in FIG. 2a the filtering part 215 generates two outputs, 220 and 222. The former of these outputs feeds the adder 235 to produce the encoded signal 240. The latter output feeds the control part 225 so as to generate a signal 230, which is used to drive the filtering part. Symmetrically, in the decoder shown in FIG. 2b the two outputs, 265 and 267, of the filtering part 260 are used, respectively, to produce the decoded signal 255 (after subtraction from the signal 250) and to drive the control part 270. As in the previous case, the output 275 of the control part drives the filtering part.

In FIGS. 3a and 3b the high-level structures of the encoder and decoder, respectively, are further expanded. Both the encoder and the decoder require a preliminary stage—blocks 315 and 372, respectively—for eliminating the undesired components of the signal, as well as the other high-frequency signals outside the band of the tape recorder. The filtering part is divided into a linear filter and a non-linear characteristic, the latter being also referred to as overshoot characteristic, the role of which will emerge more clearly from what follows. The signal 330, which corresponds to the signal 222 of FIG. 2a, is produced by the linear filter 325. The signal 352, which corresponds to the signal 220 of FIG. 2a, is produced by processing the signal 330 with the overshoot characteristic 350. Symmetrically, in the decoder shown in FIG. 3b the signal 380, which corresponds to the signal 267 of FIG. 2b, is produced by the linear filter 379. The signal 392, which corresponds to the signal 265 of FIG. 2a, is produced by processing the signal 380 with the overshoot characteristic 390 identical to the overshoot characteristic 350. It should be noted that the subtraction 268 is here performed by the inverter 377. In this way, the side effect is obtained of inverting the sign of the decoded signal 378, without this having any consequences for the audio signal reproduced during playback.

The control part is likewise divided into a control filter and a rectifying stage, also known as non-linear integrator. In the encoder shown in FIG. 3a, the signal 330, which is identical to the signal 222, is processed by a linear control filter 335, the output 340 of which feeds the non-linear integrator 342. This block produces a slowly varying signal 345, which drives the linear filter contained in the filtering part of the encoder. Similarly, in the decoder shown in FIG. 3b, the signal 380, which is identical to the signal 267, is processed by a linear control filter 382, which is identical to the linear control filter 335, and the output 384 of which feeds the non-linear integrator 386, which in turn is identical to the non-linear integrator 342. Also this block produces a slowly varying signal 388, which is identical to the signal 345 and which drives the linear filter contained in the filtering part of the decoder.

The network shown in FIG. 4 represents the non-linear integrator. The voltage-controlled input signal 410 is rectified by two non-linear resistances in parallel, each one of these being obtained by means of a resistor—$R_{415}$ and $R_{420}$—and a germanium diode—$Ge_{425}$ and $Ge_{430}$, respectively. The rectified signal is then processed by two integration stages: one is a linear resistor/capacitor stage in parallel made up of a capacitor $C_{435}$ and a resistor $R_{440}$; the other is a non-linear resistor/capacitor stage in series made up of a capacitor $C_{455}$ and a non-linear resistance defined by a resistor $R_{450}$ in parallel with a silicon diode $Si_{445}$. The control signal 460, which is equal to the level of charge of the capacitor $C_{455}$, is the signal presented at output.

The non-linear integrator illustrated in FIG. 4 is able to provide a control signal that meets the following requirements:

The rectification speed depends upon the variation in the dynamics of the input signal during the attack phase; i.e., the wider the increase in dynamics on the input, the faster the rectification.

There occurs a linear decay during a release phase; i.e., the control signal drops exponentially in the presence of a decrease in dynamics of the input signal.

There are no discontinuities in the output signal; i.e., the signal 460 presents a smooth evolution even in the presence fast attacks due to large onsets in the input signal.

Even though the non-linear integrator reacts promptly to large onsets present on the input, it cannot drive the filtering part of the decoder in the presence of large but short onsets of the signal to be encoded. In this case, the non-linear characteristic 350 provides a transient overshoot compression which has the effect of limiting the high—and undesired—dynamics of the signal 330 during onsets that are large but short. Hence, the signal 352 encodes correctly the audio signal also in the presence of large but short onsets of the signal. The role of the overshoot compression 390 at the decoding stage is, as usual, reversed, so that the signal 370 is correctly decoded even during large but short onsets of the signal.

SUMMARY OF THE INVENTION

Accordingly, it is an object of the present invention to overcome the hitherto unresolved problem of converting the non-linear feedback loop of the noise-reduction systems of the Dolby-B decoder into a system with stable operation. A further object of the present invention is to reproduce closely the transfer functions and the behavior of non-linear dynamics of the analog decoder of a noise-reduction system, such as Dolby B, in the presence of different input signals, including signals presenting large but short onsets, in such a way that the audio signal recovered using the present invention is not discernibly different from the one that would have been obtained using a Dolby-B noise-reduction decoder of an analog type.

According to the present invention the above objects are achieved thanks to a process having the characteristics referred to specifically in the ensuing claims. The invention also relates, independently, to the corresponding device, as well as to the corresponding computer-program product, which can be loaded directly into the memory of a processing device, such as a DSP, and which comprises portions of software code, which, when the product is run on the said processing device, implement the process according to the invention.

In particular, the solution according to the invention enables implementation of a noise-reduction system using signal-processing techniques of a digital type. More in particular, the solution according to the invention enables decoding of encoded audio signals using noise-reduction techniques, specifically Dolby-B techniques. The encoded signal is first processed by means of a digital filter of the sliding-band type. The signal thus processed is supplied both to a non-linear block and to a filtering stage of a linear type which contains an all-pole digital filter. The output of the non-linear block is added to the encoded signal and then processed by means of a further all-pole digital filter so as to produce the decoded signal. The output of the linear filtering chain drives a control stage which determines the parameters of the sliding-band digital filter and of the two all-pole digital filters. These parameters are determined in such a way as to emulate closely the performance of a noise-reduction decoder of an analog type, such as a Dolby-B decoder.

Basically, the non-linear feedback chain of the analog decoder is converted into a non-linear digital filtering chain of the feedforward type so as to overcome the problems caused by the delay-free non-linear feedback loop introduced by a direct conversion of the analog decoder into the digital field, which would prevent stable operation of the digital decoder itself. The fact of using a feedforward solution instead of a feedback path entails a change in the transfer characteristics of the non-linear components present in the decoder.

BRIEF DESCRIPTION OF THE DRAWINGS

The present invention will now be described, purely by way of non-limiting example, with reference to the attached drawings, in which:

FIGS. 1*a*–1*b*, 2*a*–2*b*, 3*a*–3*b*, and 4, all relating to solutions according to the prior art, have already been described;

FIGS. 5*a* (in itself corresponding to a known solution), 5*b*, 5*c*–5*d*, and 6*a*–6*b* reproduce block diagrams that are useful for understanding the conceptual bases of the solution according to the invention;

Figure 14:
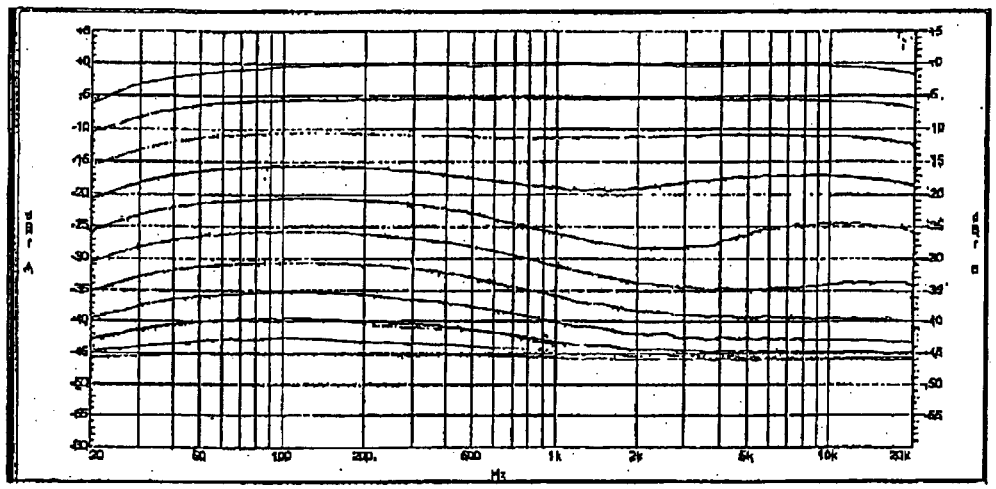

FIGS. from 7 to 13 are diagrams representing the various characteristics implemented in a device according to the invention; and FIGS. from 14 to 16 reproduce certain operating results achieved with the solution according to the invention.

DETAILED DESCRIPTION OF THE INVENTION

As a premise to the illustration of an example of embodiment of the invention, it is useful to make a number of considerations of a general nature regarding the possibility of implementing in a digital form circuits according to the prior art of the type of the ones previously illustrated with reference to FIGS. 1*a*–1*b*, 2*a*–2*b*, 3*a*–3*b* and 4.

The starting point for the above considerations will be FIG. 5*a*, which in itself illustrates a scheme that is conceptually similar to the one represented in FIG. 1*b*, the said considerations being made in conjunction with two additional basic considerations:

in the various implementations in digital form illustrated in what follows, it will be assumed that the signal sent to the input of the decoder has previously been converted (according to amply known criteria) into digital form; and in the embodiments of a digital type, an input stage, such as the stage 372 of FIG. 3*b*, may in fact be omitted, since the digitized signal at input is already free from those components the presence of which alters the activity of the system.

As is well known, using familiar techniques it is possible to reproduce the transfer function performed by the analog structure represented in FIG. 5*a* in the form of a structure purely of a feedforward type (see, for example, Sanjit K. Mitra, Digital Signal Processing. A computer-based Approach, (1998)).

In actual fact, the structure of FIG. 5*a*, in which the signal 507 is produced from the signal 505 using, as block 509, a linear analog filter, can be reproduced in the form of the structure represented in FIG. 5*b*, where a linear filter (for reasons of simplicity we shall continue to refer to an implementation of an analog type) represented by the block 517 reproduces a signal 519 identical to the signal 507, whilst a linear filter represented by the block 521 produces a signal 523 identical to the signal 511.

The structure of FIG. 5*b* can be simplified into the structure of FIG. 5*c*, where the block 537, the signal 539 and the signal 541 are respectively identical to the block 521, the signal 523 and the signal 519 of FIG. 5*b*. Finally, the (analog) linear filter represented by the block 537 can be replaced with a digital signal processor having a basically similar transfer characteristic.

This said, it may be immediately realized that the simple transposition described previously becomes far more complex, and in certain cases even impossible, if the analog linear filter represented by the block 509 of FIG. 5*a* is replaced by one or more elements with non-linear behavior. In the analog decoder of a Dolby-B noise-reduction system, the decoding stage corresponds to the structure of FIG. 5*a*, where the block 509 must, however, be replaced (see FIG. 3*b*) with the sliding-band filter 379 cascaded with the overshoot-suppression stage 390. Nevertheless, the overshoot-suppression is active only when large but short onsets arise in the signal to be decoded, in so far as otherwise the decoding stage is substantially linear. For this reason, it may be stated that a modified version of the structure represented in FIG. 5c (and in particular the modified version represented in FIG. 5d, containing an overshoot-suppression stage 560 that is active only in the presence of large but short onsets of the input signal) closely approximates the transfer characteristics of the filtering part of a Dolby-B noise-reduction system, not only when the overshoot-suppression block is inactive, but also when the said block is activated by short but large onsets of the signal to be decoded.

The resulting high-level structure is the one represented in FIG. 6a, and is substantially the one adopted in the solution according to the invention.

Each sample 660 of the encoded signal is subtracted from a processed version 668 of the same sample, which is obtained by passing it through a sliding-band digital filtering structure 662 cascaded with an overshoot-suppression stage 666. The errors introduced by the fact that the block 552 of FIG. 5d has been converted into a digital block, such as the block 662, are canceled using an all-pole digital filter 674, which processes the signal 672 to supply the decoded signal 676. As in the case of the traditional Dolby-B decoder of an analog type, the scheme of FIG. 6a envisages a non-linear path through which is passed to produce a new signal which is to be subtracted from the input signal. However, in the case of the invention this path is a path of a feedforward type, and consequently does not generate a non-linear, delay-free feedback loop.

The sample 664 produced by the sliding-band digital filtering structure is used to drive the control chain, after the errors introduced by the block 662 (which constitutes the digital transposition of the block 552 of FIG. 5d) have been canceled by the all-pole digital filter 678, which is cascaded of the corresponding processing chain so as to produce the sample 680. The control block 682 comprises a high-pass filter, also referred to as digital control filter, which is designed to approximate the transfer characteristic of the control filter 382 (FIG. 3b), in series with a non-linear stage, referred to as digital non-linear integrator, which is designed to approximate closely the transfer characteristic of the non-linear integrator shown in FIG. 4. The output 684 of the control stage is used to compute an index for looking up parameters in a lookup table. The parameters thus obtained, designated by 688, 690 and 692, are designed to drive—during processing of the next time sample—respectively the biquadratic digital filter contained in the sliding-band filtering structure 672, and two all-pole filters 674 and 678, the error-canceling characteristics of which must be modified according to the errors introduced by the sliding-band filter. The said tables are contained in the block 686. As in the case of the traditional Dolby-B decoder, the solution according to the invention uses the signal processed by the sliding-band filtering structure to drive the control chain. However, in the solution according to the present invention this signal is derived from a feedforward path, and is not instead generated within a non-linear feedback loop.

FIG. 6b of the annexed drawings basically replicates the scheme of FIG. 6a with a slightly modified formalism—above all as regards the naming of the blocks—in agreement with the terminology adopted in what follows. In particular, it will be noted that the blocks 612, 616, 624 and 628 of the scheme of FIG. 6b respectively implement the stages 662, 667, 674 and 678, which have been previously described with reference to FIG. 6a.

As explained, the filtering part of a Dolby-B decoder of an analog type has a linear behavior with the only exception of the behavior in the presence of large but short onsets of the input signal.

The transfer characteristics of the filters 612, 624 and 628 of FIG. 6b are defined in such a way that the filtering part in the invention closely approximates the characteristics of an analog decoder in conditions of linear decoding.

In particular, if H(s) denotes the transfer function of the analog filter 379 (FIG. 3—Note also the block 509 in FIG. 5a), the transfer function of the analog filter 537 required for having equivalence between the signals 507 and 541 and, likewise, between the signals 511 and 539, is given by the following equation:

$$F(s)=H(s)/(1+H(s))$$

Consequently, in the scheme of FIG. 6b the digital filtering structure 612 is designed in such a way as to approximate closely an analog filter having the transfer function F(s). As a result of the transposition into digital form of the aforesaid transfer function, in the signals 614 and 622 there are inevitably errors which will be canceled in a very precise way by the filter 624 and the filter 628. The second-order all-pole structure and the coefficient values of the said filters are determined (for example empirically) in order to minimize the difference between the analog transfer functions H(s) and F(s), and the digital transfer characteristics of the block 612 designed to produce the signal 614 (and, indirectly, the signal 622).

Instead, the signal-processing structure used in the present invention differs from the structure of the traditional analog Dolby-B decoder in non-linear decoding conditions.

The differences may basically be accounted for by the transfer characteristics of the non-linear components. In practice, the input/output characteristic of the overshoot-suppression block 390, the voltage-to-conductance characteristics of the diodes $Ge_{425}$, $Ge_{430}$ and $Si_{445}$ present in the non-linear integrator shown in FIG. 4, and finally the voltage-to-conductance characteristic of the field-effect transistor that drives the sliding-band characteristic of the analog filter 379 must be redefined in view of a transposition into the digital domain.

Consequently, the overshoot-suppression stage 616 and the digital non-linear integrator 636 of the scheme of FIG. 6b envisage the use of transfer characteristics that differ from those of the homologous analog elements. In particular, the structure of the stage 616 and of the integrator 636 is defined in such a way as to emulate the homologous stages 390 and 386 (see again FIG. 3b), with reference to a virtual replacement of the non-linear components of the latter with those defined in what follows. In particular, in the currently preferred embodiment of the invention, implementation—in digital form—is envisaged for all the signal-processing functions represented in FIG. 6b.

This may be done, for example, using a DSP, such as the double-processing-unit device available from and produced by the present applicant with the coding TDA 7500.

The Dolby level in this system is set at the value of 0.0625, corresponding to approximately −24 dB Full Scale. The internal state of the digital non-linear integrator 636, which in fact corresponds to the charge of the two capacitors $C_{435}$ and $C_{455}$, respectively measured at the points 437 and 460, is initially set at zero. This implies that the output sample from the digital non-linear integrator 638, namely $y_{NLI}$, which corresponds to the charge 460, is also set at zero.

Then, the processing steps described below are performed on each output sample.

The value $y_{NLI}$ is used to look up, in the look-up table already described previously, corresponding output values V[0], ..., V[k] on the basis of the characteristic represented in FIG. 7, where the extracted values correspond to the voltage values labeled with "+". In a particularly preferred embodiment of the invention, k is chosen equal to 51, which means that the characteristic of FIG. 7 is articulated on 52. The said characteristic (which is essentially a conductance characteristic—ordinate axis—as a function of the normalized voltage—abscissa axis) can be viewed as being obtained by a sort of contraction of the abscissa axis (voltage) of the homologous characteristic of a field-effect transistor, such as the FET CAT66, in such a way that the maximum value assumed by $y_{NLI}$ with the aforesaid Dolby level is 0.12. Otherwise, $y_{NLI}$ is clipped to the said value.

Next, the quantity V(n) is determined as the closest value smaller than or equal to $y_{NLI}$; n is extracted, and the quantity r is determined by computing the interpolation factor $$r=(y_{NLI}-V(n))/(V(n+1)-V(n))$$

Next, n is used to look up, in the corresponding look-up table, the parameters $K_s(n)$, $a_{1s}(n)$, $a_{2s}(n)$, $b_{1s}(n)$ $b_{2s}(n)$ of the biquadratic filter contained in the digital sliding-band filter 612, as well as the parameters $K_{sc}(n)$, $a_{1sc}(n)$, $a_{2sc}(n)$ of the all-pole filter 624, and the parameters $K_{cc}(n)$, $a_{1cc}(n)$, $a_{2cc}(n)$ of the all-pole filter 628. The meaning of the parameters referred to above is well known to the person skilled in the branch and does not require any detailed explanation herein.

Next, each coefficient (namely c) of the above filters is determined from the parameters looked up, by means of the following relation:

$$c=c(n)+r*(c(n+1)-c(n))$$

This technique is basically a form of linear interpolation between coefficients, given the index n and the interpolation factor r.

At this point, the values of the coefficients of the biquadratic filter contained in the sliding-band filtering structure 612, as well as the coefficients of the two all-pole filters 624 and 628 are determined unambiguously.

In particular, the determination may be made, as a function of the factors n and r, on the basis of the characteristics given in FIGS. 8, 9 and 10.

Next, the transfer function $$H_s(z)=0.70067297+K_s(1+b_{1s}z^{-1}+b_{2s}z^{-2})/(1+a_{1s}z^{-1}+a_{2s}z^{-2})$$

of the sliding-band digital filtering structure 612 is applied to the input sample 612, so as to compute the sample 614.

The overshoot-suppression characteristic 616 corresponding to the input-output characteristic of FIG. 11 is then applied to the sample 614. In this way, the sample 618 is calculated, which is subtracted from the input 610 by means of the adder 620, so as to calculate the sample 622.

The transfer function of the all-pole digital filter 624 is applied to the sample 622, so as to compute the output sample 626.

The characteristic of the all-pole digital filter 628 is then applied to the sample 614 to compute the sample 630. To the latter sample is applied the transfer function of the digital control filter 632:

$$H_c(z)=(0.55650835-0.4579547z^{-1})/(1-0.01446301z^{-1})$$

in order to calculate the sample 634.

The sample 634 is then amplified (for example by a factor of 16) to produce the input sample $x_{NLI}$ for non-linear rectification.

Then the voltage difference corresponding to that of the silicon diode $Si_{445}$ of the non-linear integrator is determined. In particular, denoting by $s_{NLI}$ the charge level of the capacitor $C_{435}$, measured at point 437 (with reference to the scheme of FIG. 4) the said voltage is equal to $s_{NLI}-y_{NLI}$.

The conductance $G_{si}$ of the diode $Si_{445}$ is then emulated in digital form. This is done by means of a look-up table corresponding to the characteristic illustrated in FIG. 12, and hence choosing the closest voltage level smaller than or equal to the difference $s_{NLI}-y_{NLI}$; otherwise, the maximum voltage value contained in the look-up table is chosen. The voltage value chosen identifies the conductance value determined. It will be appreciated that the characteristic in question may be viewed as being obtained by contracting by a factor of approximately 800 the axis of the abscissa (voltage) of the voltage characteristic (conductance) of a reference CAT66 silicon diode. The aforesaid factor is determined empirically, in such a way that the dynamics of the output signal in the present invention will not be appreciably different from the dynamics of the signal decoded by a Dolby-B decoder.

If $x_{NLI} \geq 0$, then the voltage difference is determined across the germanium diode $Ge_{425}$ in parallel with the resistor $r_{415}$. If $x_{NLI}<0$, then the voltage difference is instead determined across the germanium diode $Ge_{450}$ in parallel with the resistor R420. Since the two germanium diodes in question are identical, as likewise are the resistors in parallel thereto, the said function can be calculated in digital form by computing the absolute value of $x_{NLI}$, and then computing the difference between said absolute value and $s_{NLI}$, the latter voltage applying in any case to both of the two branches considered.

Next, the conductance of the one of the two branches that is actually conducting, depending on the sign of $x_{NLI}$, is determined. Once again, this is done resorting to a look-up table corresponding to the characteristic represented in FIG. 13 and choosing the closest voltage value smaller than or equal to the aforesaid difference; otherwise, the maximum voltage value contained in the look-up table is chosen. The conductance value looked up is then determined as the conductance associated to the chosen voltage. The characteristic of FIG. 13 is obtained by shrinking by a factor of 60 the voltage axis (abscissa) of the voltage/conductance characteristic of a reference CAT66 germanium diode in series with a 5600-ohm resistor. The said factor is determined empirically in such a way that the dynamics of the output signal will not be appreciably different from the dynamics of the signal decoded by a Dolby-B decoder.

Next, the values $sn_{NLI}$ and $yn_{NLI}$ are calculated by solving, according to known criteria, Kirchhoff's equations for the electrical network corresponding to the non-linear integrator of the Dolby-B decoder. In particular, this is done, not only according to the parameters already seen previously, but also according to the parameters corresponding to the conductances of the components $R_{440}$ and $R_{450}$ of the scheme of FIG. 4. Specifically, the coefficients are determined by the structure of the space of the states of the digital non-linear integrator present in the scheme according to the invention.

The corresponding criteria are well known to the art, as evidenced, for instance, by the work of Sanjit K. Mitra cited previously.

In order to solve the aforesaid equations in the digital domain for a given sampling frequency, namely $F_s$, the following voltage/current relation has been specifically adopted:

$$vn=v+i/F_sC.$$

In practice, this corresponds to calculating the charge Vn for the next sample in relation to a capacitance C charged with the voltage v and traversed by a current i. In particular, v=R*i makes it possible to calculate the voltage on a resistor R traversed by a current i during a time interval.

The new output sample of the digital non-linear integrator 460 is $yn_{NLI}$. The procedure so far described is then repeated to compute a new output sample 626, given the new input sample 610.

As is in any case evident for a person skilled in the sector, without prejudice to the general basic approach adopted for implementing the solution according to the invention, the choice of the specific design criteria referred to previously, in particular as regards the choice of the characteristics represented in FIGS. 7 to 13, is presented purely by way of example in order to illustrate the embodiment of the invention that is currently preferred. The specific choice of one characteristic or another, or of particular details of implementation, must not therefore be interpreted as in any way limiting the scope of the present invention.

The proposed embodiment of the invention provides optimal decoding of the encoded signal when the input appears in the sampled form of the analog signal at a frequency of 48 507 samples per second, or 48 507 kHz. Indeed, it has been verified that the invention closely emulates the behavior of an analog Dolby-B decoder even if the sampling frequency presents a 10% deviation from its optimal value.

This makes it possible to use the solution according to the invention both in the case of FM radio broadcasting according to the European and American standard, using a 48 507-kHz sampling frequency, and in the case of FM radio broadcasting according to the Japanese standard, which envisages a sampling frequency of 44 132 kHz. In particular, the device according to the invention is suited for implementation in a DSP, which, with reference to the possible applications recalled previously, enables clock frequencies in the region of 43.46 MHz and 45.19 MHz to be used. In this way, it is possible to prevent there being any residual frequency components deriving from the DSP clock in the FM radio frequency range from 87.5 MHz to 108 MHz for Europe and America, and from 76 MHz to 90 MHz for Japan.

In the analog Dolby-B decoder, the Dolby level is established in the phase of design of the integrated circuit, whereas in the invention presented herein it can be defined through the variation of a software parameter. The choice of the Dolby level is limited by two factors: an upper bound, determined by specific headroom requirements (−15 dB Full Scale) and a lower bound which can be put down to the unavoidable ground noise of the analog-to-digital converter (−93 dB Full Scale).

The performance of the invention is not affected by variations in manufacturing lots or variations in temperature as in the case of implementations based upon analog integrated circuits or discrete components, where each component is affected by drift due to age and temperature.

FIG. 14 shows various frequency responses, each one obtained by applying as input signal to application based upon the invention a sinusoid of a given amplitude (from 0 dB Dolby level to −45 dB Dolby level, through 5-dB steps). Each sinusoid slowly sweeps along the 20 Hz-20 kHz range.

Figure 15:
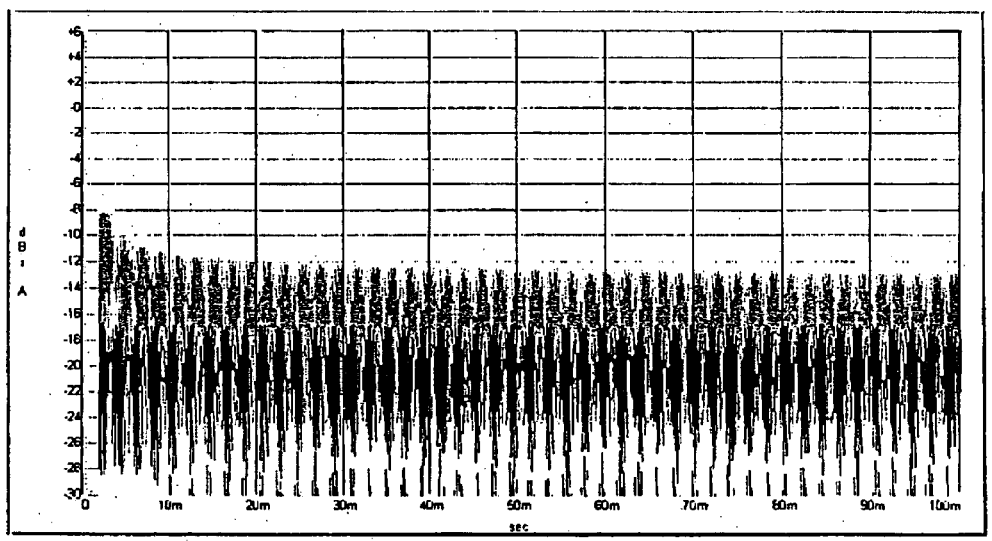

FIG. 15 shows three attack time responses using a 1-kHz sinusoid enveloped to −17 dB Dolby level.

The measurements were carried out in the following conditions:

Dolby-B noise-reduction reference encoder enabled, and Dolby-B noise-reduction decoder implemented as DSP disabled (dark gray);

Dolby-B noise-reduction reference encoder enabled, and Dolby-B noise-reduction decoder implemented as DSP enabled (black); and Dolby-B noise-reduction reference encoder disabled, and Dolby-B noise-reduction decoder implemented as DSP disabled (light gray).

FIG. 16 shows three recovery-time responses of the system using a 2-kHz sinusoid enveloped to −15 dB Dolby level after 100 ms.

The measurements were carried out in the following conditions:

Dolby-B noise-reduction reference encoder enabled, and Dolby-B noise-reduction decoder implemented as DSP disabled (dark gray);

Dolby-B noise-reduction reference encoder enabled, and Dolby-B noise-reduction decoder implemented as DSP enabled (black); and Dolby-B noise-reduction reference encoder disabled, and Dolby-B noise-reduction decoder implemented as DSP disabled (light gray).

In both cases (attack and recovery), the overall response of the system based upon the present invention meets the Dolby-B noise-reduction requirements.

Of course, without prejudice to the principle of the invention, the details of construction and the embodiments may vary widely with respect to what is described and illustrated herein, without thereby departing from the scope of the present invention as defined in the ensuing claims. In particular, it will be appreciated that, even though the foregoing description specifically refers to audio signals subjected to Dolby-B noise-reduction encoding, the scope of the invention extends also to similar types of encoding; consequently, the scope of the present invention is not to be in any way understood as being limited to the sole Dolby-B type encoding.

What is claimed is:

1. A digital process for decoding audio signals comprising:

a sliding-band filtering operation carried out on an input signal to generate a filtered signal;

an overshoot-suppression operation carried out on said filtered input signal to generate a processed signal;

an adding operation to generate a difference signal between said input signal and said processed signal, said difference signal used to generate an output signal; and a control operation carried out on said filtered signal before the overshoot-suppression operation to generate a control signal for said sliding-band filtering operation.

2. The process of claim 1, further comprising a linear filtering operation for generating said output signal from said difference signal.

3. The process of claim 2, wherein said linear filtering operation is performed with an all-pole filter.

4. The process of claim 1 further comprising a further linear filtering operation performed on said filtered signal.

5. The process of claim 4, wherein said further linear filtering operation is performed with an all-pole filter.

6. The process of claim 2, wherein said control operation generates a further control signal for said linear filtering operation.

7. The process of claim 4, wherein said control operation generates yet a further control signal for said further linear filtering operation.

8. The process of claim 1, wherein said control operation comprises cascading a high-pass filtering operation and a non-linear processing operation.

9. The process of claim 8, wherein said non-linear processing operation performs the transfer characteristic of a non-linear integrator.

10. The process of claim 8, wherein said non-linear processing operation comprises at least one parameter-computation operation with the use of look-up tables.

11. The process of claim 1, wherein said sliding-band filtering operation comprises biquadratic filtration.

12. The process of claim 2, wherein said control operation controls said linear filtering operation to minimize errors introduced by said sliding-band filtering operation.

13. The process of claim 1, wherein said processing operations are implemented by digital signal processing means.

14. The process of claim 1, wherein said processing operations are implemented in an integrated circuit in a digital audio-signal processing system.

15. A digital circuit for decoding audio signals comprising:
- a sliding-band filtering structure for receiving an input signal and for generating a filtered signal;
- an overshoot-suppression stage for receiving said filtered input signal and for generating a processed signal;
- an adder node to generate a difference signal between said input signal and said processed signal, said difference signal used to generate an output signal; and
- a control chain for receiving said filtered signal before the overshoot-suppression operation to generate a control signal for said sliding-band filtering structure.

16. The circuit of claim 15, further comprising a linear filter for generating said output signal from said difference signal.

17. The circuit of claim 16, wherein said linear filter comprises an all-pole filter.

18. The circuit of claim 15 further comprising a further linear filter acting on said filtered signal.

19. The circuit of claim 18, wherein said further linear filter comprises an all-pole filter.

20. The circuit of claim 16, wherein said control chain further comprises means for generating a further control signal for said linear filter.

21. The circuit of claim 18, wherein said control chain further comprises means for generating yet a further control signal for said further linear filter.

22. The circuit of claim 15, wherein said control chain comprises a cascaded high-pass filter and a non-linear stage.

23. The circuit of claim 22, wherein said non-linear stage comprises the transfer characteristic of a non-linear integrator.

24. The circuit of claim 22, wherein said non-linear stage comprises at least one parameter-computation stage with the use of look-up tables.

25. The circuit of claim 15, wherein said sliding-band filtering structure comprises a biquadratic filter.

26. The circuit of claim 16, wherein said control chain is coupled to said linear filter to minimize errors introduced by said sliding-band filtering structure.

27. The circuit of claim 15, wherein said sliding-band filtering structure, said overshoot-suppression stage, said adder node, and said control chain each comprise digital signal processing circuitry.

28. The circuit of claim 15, wherein said sliding-band filtering structure, said overshoot-suppression stage, said adder node, and said control chain comprise an integrated circuit in a digital audio-signal processing system.

29. A computer-program audio signal decoding product directly loadable into the memory of a digital computer, comprising:
- software code portions for performing a sliding-band filtering operation carried out on an input signal to generate a filtered signal, an overshoot-suppression operation carried out on said filtered input signal to generate a processed signal, an adding operation to generate a difference signal between said input signal and said processed signal, said difference signal used to generate an output signal, and a control operation carried out on said filtered signal before the overshoot-suppression operation to generate a control signal for said sliding-band filtering operation, wherein said product is run on the digital computer.

* * * * *